US012648346B2

(12) United States Patent
Yang et al.

(10) Patent No.:   US 12,648,346 B2
(45) Date of Patent:       Jun. 2, 2026

(54) APPARATUS AND METHOD FOR EVALUATING LIGHT STABILITY OF MATERIAL FOR ORGANIC LAYER OF ORGANIC LIGHT-EMITTING ELEMENT

(71) Applicant: LG CHEM, LTD., Seoul (KR)

(72) Inventors: Hak Kyun Yang, Daejeon (KR); Jeonghyun Kim, Daejeon (KR); Heejoo Lee, Daejeon (KR); Wonjong Yoo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 375 days.

(21) Appl. No.:   18/026,176

(22) PCT Filed:   Nov. 16, 2021

(86) PCT No.:   PCT/KR2021/016792
§ 371 (c)(1),
(2) Date:   Mar. 14, 2023

(87) PCT Pub. No.:   WO2022/119180
PCT Pub. Date: Jun. 9, 2022

(65) Prior Publication Data
US 2023/0363247 A1      Nov. 9, 2023

(30) Foreign Application Priority Data
Dec. 4, 2020      (KR) ........................ 10-2020-0168430

(51) Int. Cl.
*H10K 71/70*          (2023.01)

(52) U.S. Cl.
CPC .................................... *H10K 71/70* (2023.02)

(58) Field of Classification Search
CPC ..... H10K 71/70; G01N 17/004; G01N 17/002
See application file for complete search history.

(56) References Cited

U.S. PATENT DOCUMENTS

| | | |
|---|---|---|
| 5,636,015 A | 6/1997 | Imura et al. |
| 2007/0009397 A1 | 1/2007 | Hehl |

(Continued)

FOREIGN PATENT DOCUMENTS

| | | |
|---|---|---|
| CN | 204359664 U | 5/2015 |
| CN | 106706507 A | 5/2017 |

(Continued)

OTHER PUBLICATIONS

Environmental Sciences Photostability Chamber (Year: 2015).*

(Continued)

*Primary Examiner* — Fernando L Toledo
*Assistant Examiner* — Marshall Mu-Nuo Hatfield
(74) *Attorney, Agent, or Firm* — Bryan Cave Leighton Paisner LLP

(57)          ABSTRACT

An apparatus for evaluating photostability of a material for an organic material layer of an organic light emitting device, the apparatus comprising a photostability chamber provided with at least four light source zones, comprising a first light source zone provided with a daylight light source; a second light source zone provided with a white fluorescent light source; a third light source zone provided with a UV-cutoff (UV-cut) light source; and a fourth light source zone to which no light is irradiated.

9 Claims, 9 Drawing Sheets

<BEFORE IRRADIATING DAYLIGHT>

<AFTER IRRADIATING DAYLIGHT>

(56)                  References Cited

U.S. PATENT DOCUMENTS

| | | | |
|---|---|---|---|
| 2010/0045994 A1 | 2/2010 | Ogawa | |
| 2010/0068750 A1 | 3/2010 | Pogosjan et al. | |
| 2014/0315187 A1 | 10/2014 | Guo et al. | |
| 2015/0068328 A1 | 3/2015 | Rudolph et al. | |
| 2019/0114757 A1* | 4/2019 | Lee ........................... | G06T 7/90 |
| 2021/0119126 A1* | 4/2021 | Kawakami ............ | G01N 21/27 |

FOREIGN PATENT DOCUMENTS

| | | | | |
|---|---|---|---|---|
| CN | 206862852 U | 1/2018 | | |
| CN | 108956486 A * | 12/2018 | ............. | G01N 25/00 |
| JP | 20010004526 A | 1/2001 | | |
| JP | 20040341423 A | 12/2004 | | |
| JP | 3203769 U | 4/2016 | | |
| JP | 2019-090829 | 6/2019 | | |
| KR | 10-2010-0017097 | 2/2010 | | |
| KR | 10-2012-0079705 | 7/2012 | | |
| KR | 10-2014-0058669 | 5/2014 | | |
| KR | 10-1433250 | 9/2014 | | |
| KR | 10-2015-0109542 | 10/2015 | | |
| KR | 10-1881225 | 7/2018 | | |
| WO | 2015-085066 | 6/2015 | | |

OTHER PUBLICATIONS

Weiss Technik Photostability Chamber (Year: 2017).*

Philips light sources (Year: 2019).*

Vostchtechnik photostability chambers (Year: 2016).*

Weiss Technik photostability chambers (Year: 2017).*

6020 & 6040 Series Environmental Chambers Operations Manual, Rev. E—Feb. 14, 2012, Caron Products & Services, Inc. (Marietta, OH), 66 pages (2012).

Model 6540/6545 Photostability Chamber Operations Manual, Rev_ I—Jan. 12, 2016, Caron Products & Services, Inc. (Marietta, OH), 68 pages (2016).

Gevorgyan et al., "A compact multi-chamber setup for degradation and lifetime studies of organic solar cells," Solar Energy Materials & Solar Cells, 95:1389-1397 (2011).

* cited by examiner

【FIG. 1】
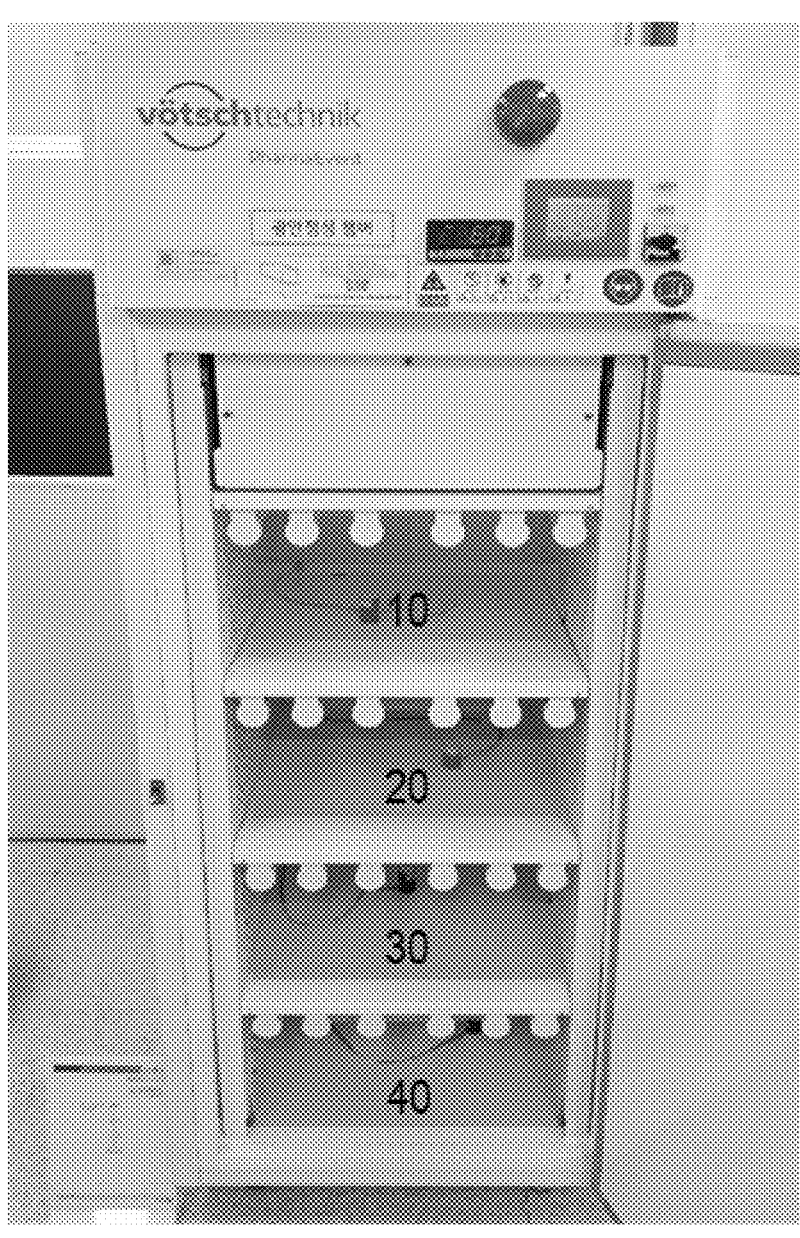

【FIG. 2】
<WAVELENGTH REGION OF DAYLIGHT LIGHT SOURCE>
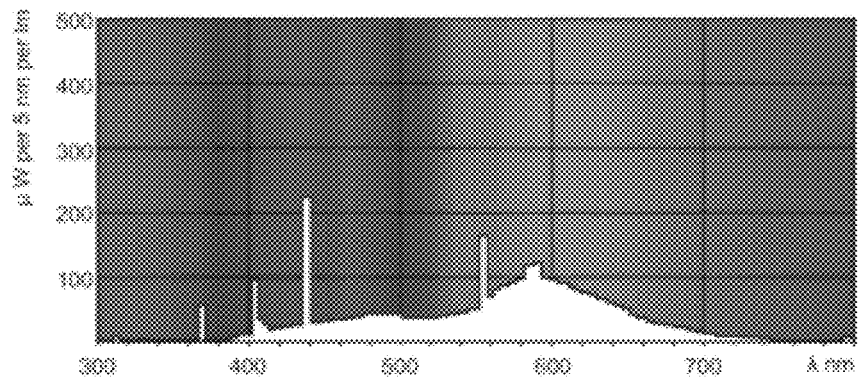
<WAVELENGTH REGION OF WHITE FLUORESCENT LIGHT SOURCE>
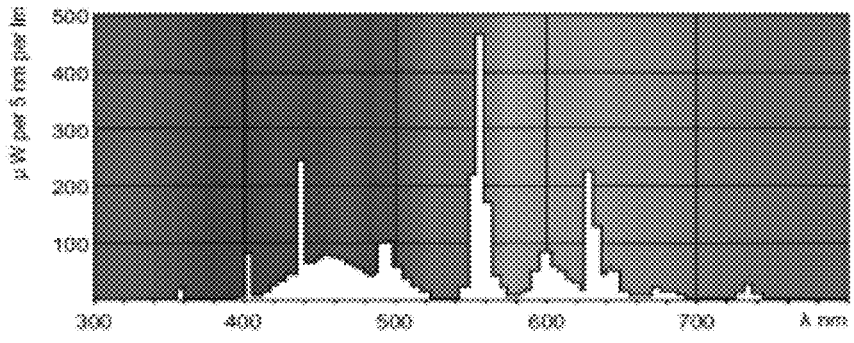
<WAVELENGTH REGION OF UV-CUT LIGHT SOURCE >
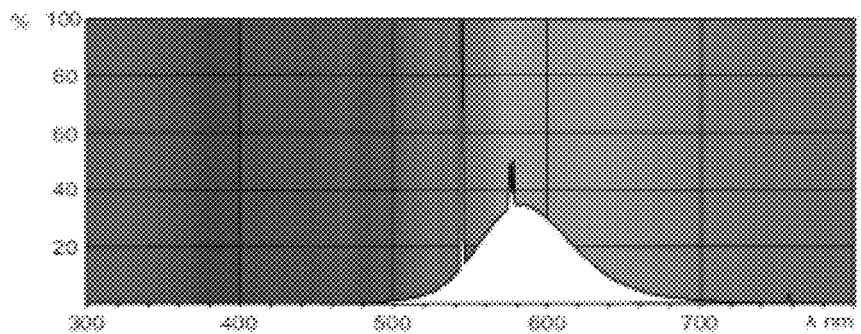

【FIG. 3】
<BEFORE IRRADIATING DAYLIGHT>
<AFTER IRRADIATING DAYLIGHT>
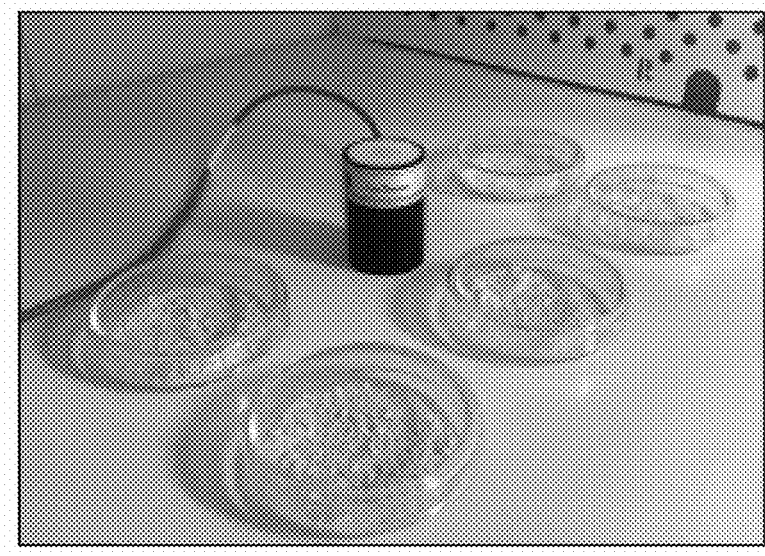

【FIG. 4】

| Lamp Type | Time (Hr) | HPLC (Retention time/Area %) | | |
|---|---|---|---|---|
| | | 3.9 min | 5.9 min | 7.9 min |
| Daylight | 0.5 | | | 100.000 |
| | 1.0 | | 0.0028 | 99.9972 |
| | 2.0 | 0.0008 | 0.0027 | 99.9965 |
| | 4.0 | 0.0025 | 0.0073 | 99.9902 |
| WHITE | 0.5 | | | 100.000 |
| | 1.0 | | 0.0017 | 99.9983 |
| | 2.0 | | 0.0018 | 99.9982 |
| | 4.0 | 0.0018 | 0.0063 | 99.9919 |
| UV-Cut | 0.5 | | | 100.000 |
| | 1.0 | | | 100.000 |
| | 2.0 | | | 100.000 |
| | 4.0 | | | 100.000 |
| Lamp-off | 0.5 | | | 100.000 |
| | 1.0 | | | 100.000 |
| | 2.0 | | | 100.000 |
| | 4.0 | | | 100.000 |

☐ : IMPURITIES CAUSED BY LIGHT EXPOSURE

【FIG. 5】
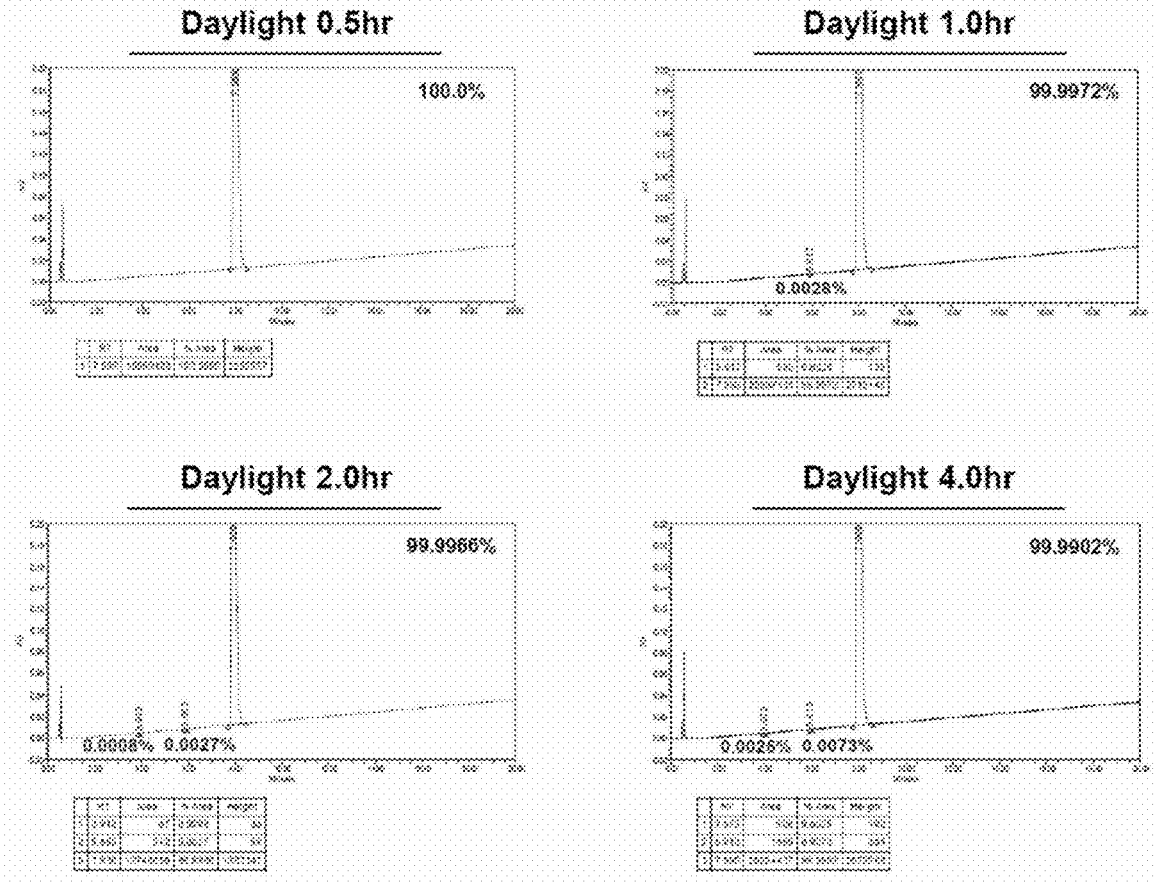

【FIG. 6】
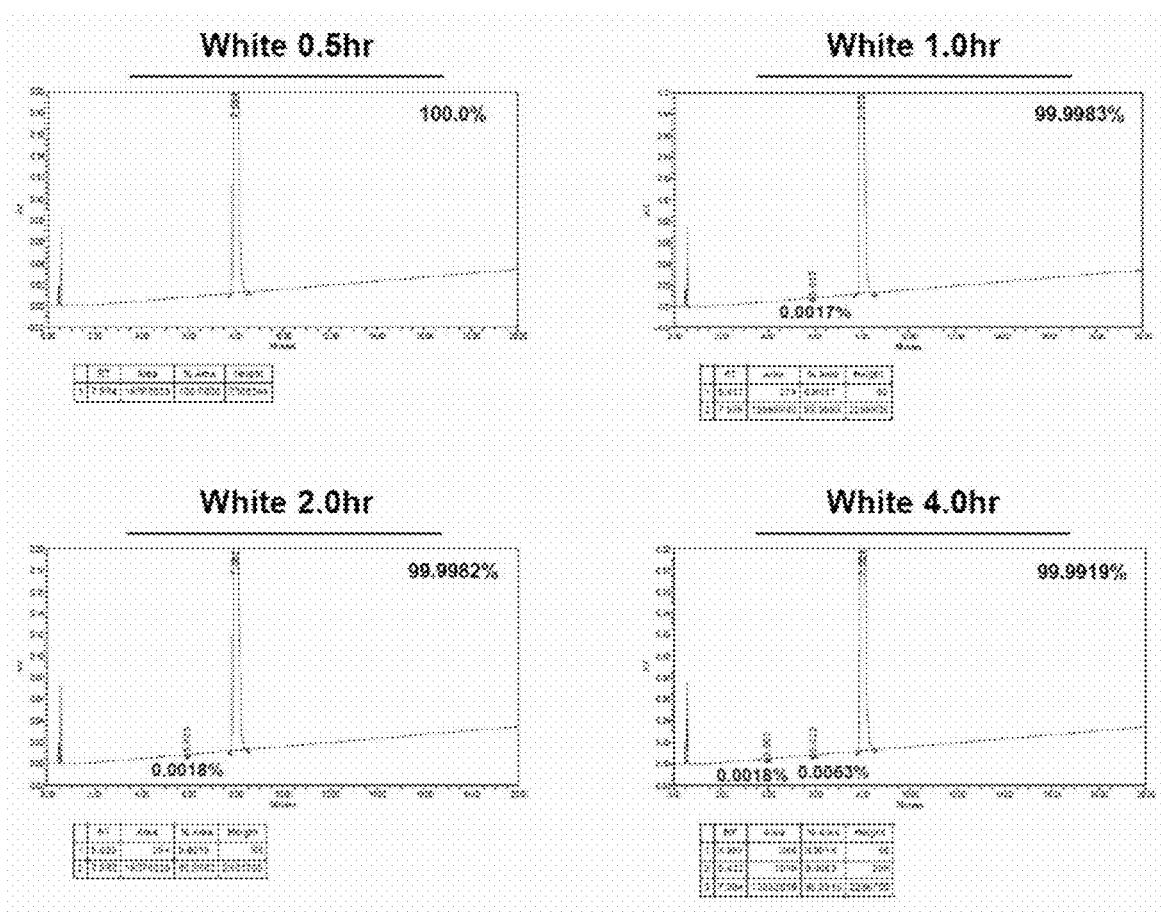

【FIG. 7】
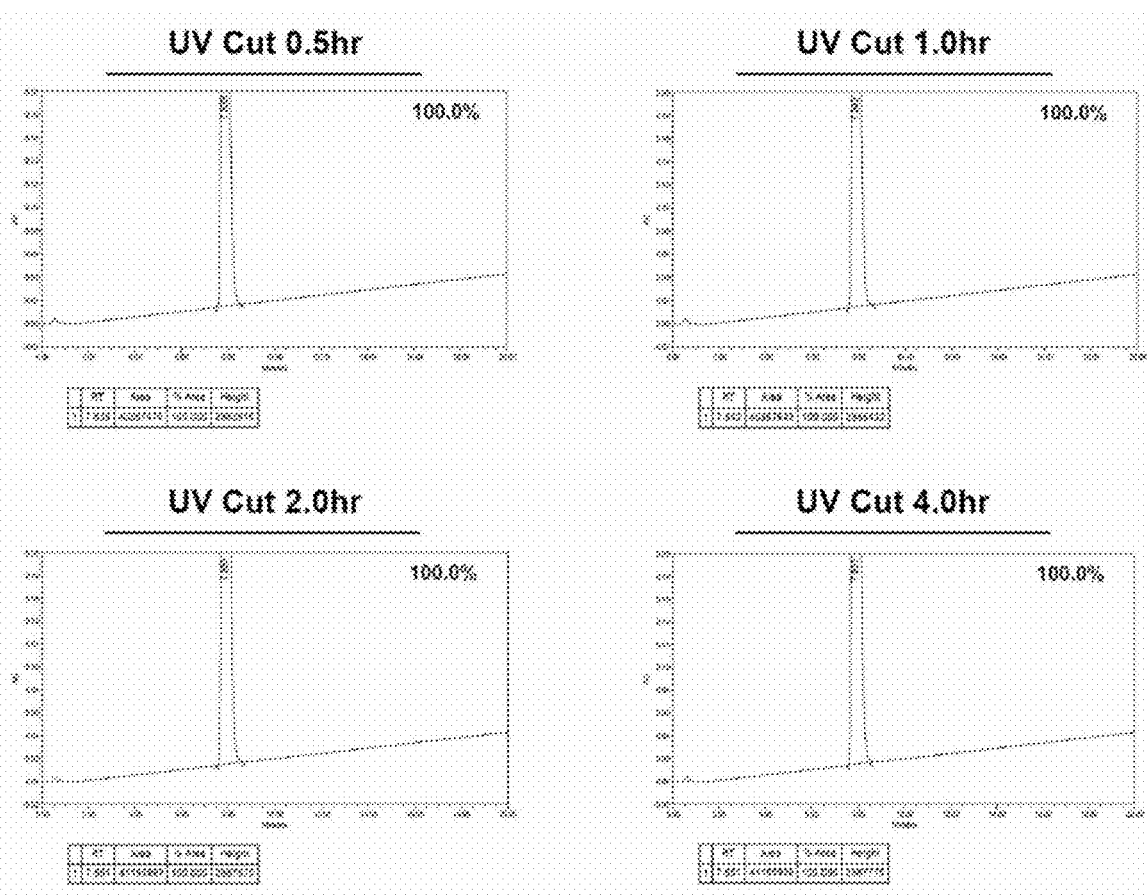

【FIG. 8】
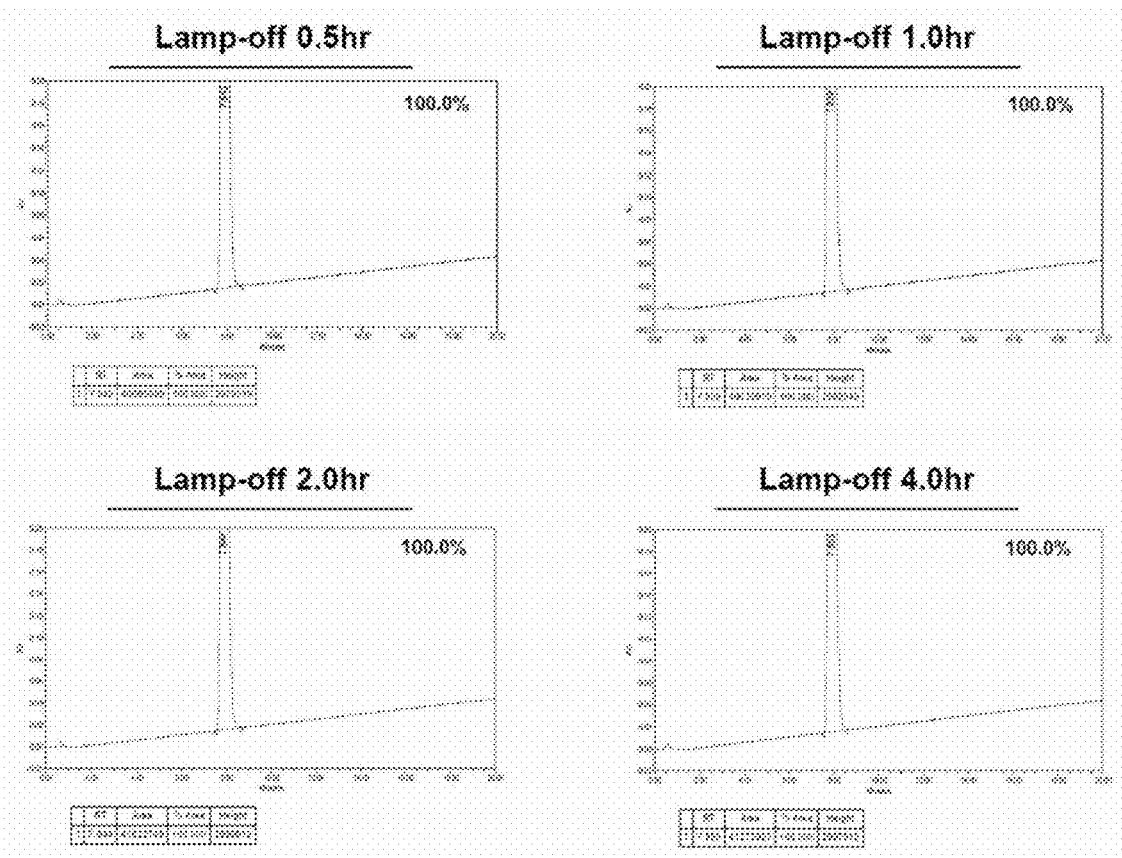
【FIG. 9】
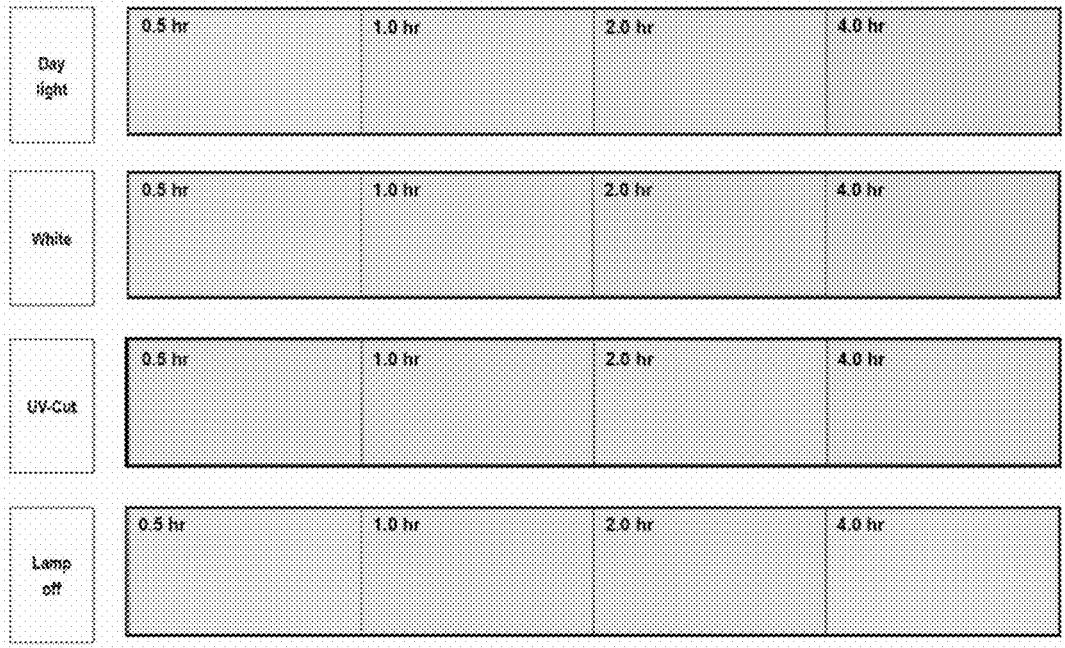

【FIG. 10】

| Day light | Name | L* | a* | b* |
|---|---|---|---|---|
| | Day 0.5 hr | 91.32 | 0.62 | -8.36 |
| | Day 1.0 hr | 89.20 | -0.73 | 0.45 |
| | Day 2.0 hr | 88.78 | -0.16 | 1.49 |
| | Day 4.0 hr | 86.96 | 0.21 | 4.44 |

| White | Name | L* | a* | b* |
|---|---|---|---|---|
| | White 0.5 hr | 90.83 | -0.14 | -3.8 |
| | White 1.0 hr | 89.31 | 0.21 | -0.77 |
| | White 2.0 hr | 87.91 | 0.02 | 0.51 |
| | White 4.0 hr | 87.67 | 0.31 | 1.84 |

| UV-Cut | Name | L* | a* | b* |
|---|---|---|---|---|
| | UVC 0.5 hr | 91.22 | 0.54 | -9.01 |
| | UVC 1.0 hr | 90.73 | 0.65 | -8.65 |
| | UVC 2.0 hr | 90.88 | 0.58 | -8.86 |
| | UVC 4.0 hr | 90.45 | 0.28 | -7.1 |

| Lamp off | Name | L* | a* | b* |
|---|---|---|---|---|
| | Lamp-off 0.5 hr | 91.35 | 0.77 | -10.19 |
| | Lamp-off 1.0 hr | 91.97 | 0.65 | -9.46 |
| | Lamp-off 2.0 hr | 91.34 | 0.85 | -10.02 |
| | Lamp-off 4.0 hr | 91.80 | 0.96 | -10.13 |

APPARATUS AND METHOD FOR EVALUATING LIGHT STABILITY OF MATERIAL FOR ORGANIC LAYER OF ORGANIC LIGHT-EMITTING ELEMENT

CROSS-REFERENCE TO RELATED APPLICATION(S)

This application is a National Stage Application of International Application No. PCT/KR2021/016792 filed on Nov. 16, 2021, which claims priority to and the benefits of Korean Patent Application No. 10-2020-0168430, filed with the Korean Intellectual Property Office on Dec. 4, 2020, the entire contents of which are incorporated herein by reference.

TECHNICAL FIELD

The present application relates to an apparatus and a method for evaluating photostability of a material for an organic material layer of an organic light emitting device.

BACKGROUND

An organic light emitting device is a light emitting device using an organic semiconductor material, and requires an exchange of holes and/or electrons between an electrode and the organic semiconductor material. An organic light emitting device can be largely divided into two types as follows depending on the operation principle. The first is a light emitting device type in which excitons are formed in an organic material layer by photons introduced to a device from an external light source, these excitons are separated into electrons and holes, and these electrons and holes are each transferred to different electrodes and used as a current source (voltage source). The second is a light emitting device type in which, by applying a voltage or current to two or more electrodes, holes and/or electrons are injected into an organic semiconductor material layer forming an interface with the electrodes, and the light emitting device is operated by the injected electrons and holes.

An organic light emission phenomenon generally refers to a phenomenon converting electrical energy to light energy using an organic material. An organic light emitting device using an organic light emission phenomenon normally has a structure comprising an anode, a cathode, and an organic material layer therebetween. Herein, the organic material layer is often formed in a multilayer structure formed with different materials in order to increase efficiency and stability of the organic light emitting device, and for example, can be formed with a hole injection layer, a hole transfer layer, a light emitting layer, an electron blocking layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state. Such an organic light emitting device is known to have properties such as self-emission, high luminance, high efficiency, low driving voltage, wide viewing angle and high contrast.

Materials used as an organic material layer in an organic light emitting device can be divided into a light emitting material and a charge transfer material, for example, a hole injection material, a hole transfer material, an electron blocking material, an electron transfer material, an electron injection material and the like depending on the function. The light emitting material comprises, depending on light emitting color, blue, green and red light emitting materials, and yellow and orange light emitting materials required for obtaining better natural colors.

BRIEF DESCRIPTION

Technical Problem

The present application is directed to providing an apparatus and a method for evaluating photostability of a material for an organic material layer of an organic light emitting device.

Technical Solution

According to one embodiment of the present application, provided is an apparatus for evaluating photostability of a material for an organic material layer of an organic light emitting device, the apparatus comprising a photostability chamber provided with at least four light source zones:

a first light source zone provided with a daylight light source; a second light source zone provided with a white fluorescent light source; a third light source zone provided with a UV-cut light source; and a fourth light source zone to which no light is irradiated.

Another embodiment of the present application provides a method for evaluating photostability of a material for an organic material layer of an organic light emitting device, the method comprising:

preparing the apparatus for evaluating photostability of a material for an organic material layer of an organic light emitting device;

placing a sample in each of the at least four light source zones;

irradiating daylight to the first light source zone, irradiating white fluorescence to the second light source zone, irradiating UV-cut light to the third light source zone, and maintaining the fourth light source zone without irradiating a separate light thereto; and evaluating photostability of the samples by retrieving the samples placed in the at least four light source zones.

Advantageous Effects

According to one embodiment of the present application, a method for evaluating photostability considering actual light exposure circumstances for a material for an organic material layer of an organic light emitting device can be provided. Particularly, through the apparatus and the method for evaluating photostability according to one embodiment of the present application, an occurrence of denaturation and a degree of denaturation caused by light exposure of the corresponding material for an organic material layer of an organic light emitting device can be quantitatively identified.

Accordingly, through the apparatus and the method for evaluating photostability according to one embodiment of the present application, changes over time in the material for an organic material layer of an organic light emitting device can be verified in advance, and as a result, the apparatus and the method can become a reliability evaluation standard in the related industry.

DESCRIPTION OF THE DRAWINGS

FIG. 1 is a photograph illustrating an apparatus for evaluating photostability of a material for an organic material layer of an organic light emitting device as one embodiment of the present application.

FIG. 2 is a diagram illustrating wavelength regions of a daylight light source, a white fluorescent light source and a UV-cut light source according to one embodiment of the present application.

FIG. 3 is a photograph showing a degree of sample discoloration before and after irradiating daylight in Example 1 of the present application.

FIG. 4 to FIG. 8 are diagrams each showing a result of HPLC measurement using a method for evaluating photostability of the present application.

FIG. 9 and FIG. 10 are diagrams each showing a result of chromaticity measurement using a method for evaluating photostability of the present application.

REFERENCE NUMERALS

10: First Light Source Zone
20: Second Light Source Zone
30: Third Light Source Zone
40: Fourth Light Source Zone

DETAILED DESCRIPTION

Hereinafter, the present application will be described in more detail.

In the present disclosure, a description of a certain member being placed "on" another member comprises not only a case of the certain member being in contact with the another member but a case of still another member being present between the two members.

In the present disclosure, a description of a certain part "comprising" certain constituents means capable of further comprising other constituents, and does not exclude other constituents unless particularly stated on the contrary.

As described above, various materials that can be used as an organic material layer of an organic light emitting device have been developed. In addition, the material for an organic material layer of an organic light emitting device has a possibility of being exposed to light and denatured under various environments, however, there are no standardized standards, methods and the like for evaluating photostability of a material for an organic material layer of an organic light emitting device in the art. Accordingly, the present application is directed to providing a method and an apparatus for evaluating photostability considering actual light exposure circumstances for a material for an organic material layer of an organic light emitting device.

The apparatus for evaluating photostability of a material for an organic material layer of an organic light emitting device according to one embodiment of the present application comprises a photostability chamber provided with at least four light source zones: a first light source zone provided with a daylight light source; a second light source zone provided with a white fluorescent light source; a third light source zone provided with a UV-cut light source; and a fourth light source zone to which no light is irradiated.

In one embodiment of the present application, the at least four light source zones comprise a first light source zone provided with a daylight light source; a second light source zone provided with a white fluorescent light source; a third light source zone provided with a UV-cut light source; and a fourth light source zone to which no light is irradiated.

The daylight light source of the first light source zone is a substitute for natural light, and considers an environment exposable in a synthesis facility of a material for an organic material layer of an organic light emitting device. The daylight has a color temperature of approximately 4,000K.

The white fluorescent light source of the second light source zone considers an environment exposable in a synthesis facility of a material for an organic material layer of an organic light emitting device and in a material weighing room of a panel manufacturer. In the present application, the white fluorescent light source can also be referred to as a cool daylight light source, and the color temperature is approximately 6,500K.

The UV-cut light source of the third light source zone is a UV wavelength-removed light source, and considers an environment exposable in a sublimation facility of a material for an organic material layer of an organic light emitting device and in a manufacturing clean room of a panel manufacturer. The UV-cut light source has a color temperature of approximately 3,000K.

The fourth light source zone is for comparing with the first light source zone to the third light source zone, and no light is irradiated thereto. The fourth light source zone may not be provided with the daylight light source, the white fluorescent light source and the UV-cut light source, and can be provided with a lamp with the lamp being turned off.

In addition, there is no chance that the material for an organic material layer of an organic light emitting device is directly exposed to a UV light source in a manufacturing process of the material for an organic material layer of an organic light emitting device and a panel manufacturing process of an organic light emitting device, and therefore, the UV light source can be excluded in one embodiment of the present application.

Wavelength regions of the daylight light source, the white fluorescent light source and the UV-cut light source according to one embodiment of the present application are shown in FIG. 2.

In one embodiment of the present application, the at least four light source zones can each independently be maintained at a temperature of 15° C. to 50° C. and a humidity of 20% to 90%. In addition, the at least four light source zones can be maintained at a temperature of 25° C. and a humidity of 40%, temperature and humidity conditions in a common material manufacturing environment. In addition, the at least four light source zones can each be maintained at constant temperature and humidity, and can all be maintained at the same temperature and humidity. Herein, the temperature deviation can be ±1° C., and the humidity deviation can be ±2%.

In one embodiment of the present application, the at least four light source zones can each further comprise a shelf on which the sample is placed. Herein, the at least four light source zones are vertically provided in the photostability chamber in consecutive order, and the at least four light source zones can be separated from each other by the shelf, as exemplified in FIG. 1.

The apparatus for evaluating photostability of a material for an organic material layer of an organic light emitting device according to one embodiment of the present application is illustrated in FIG. 1. As illustrated in FIG. 1, the apparatus for evaluating photostability of a material for an organic material layer of an organic light emitting device according to one embodiment of the present application comprises a photostability chamber comprising at least four light source zones: a first light source zone (10) provided with a daylight light source; a second light source zone (20) provided with a white fluorescent light source; a third light source zone (30) provided with a UV-cut light source; and a fourth light source zone (40) to which no light is irradiated.

In addition, the method for evaluating photostability of a material for an organic material layer of an organic light emitting device according to another embodiment of the present application comprises preparing the apparatus for evaluating photostability of a material for an organic material layer of an organic light emitting device; placing a sample in each of the at least four light source zones; irradiating daylight to the first light source zone, irradiating white fluorescent light to the second light source zone, irradiating UV-cut light to the third light source zone, and maintaining the fourth light source zone without irradiating a separate light thereto; and evaluating photostability of the samples by retrieving the samples placed in the at least four light source zones.

In the method for evaluating photostability according to one embodiment of the present application, descriptions on the at least four light source zones are the same as the descriptions provided above.

In one embodiment of the present application, the time of irradiating the daylight, the white fluorescent light and the UV-cut light can be from 0.5 hours to 12 hours, and from 0.5 hours to 4 hours.

In one embodiment of the present application, the evaluating of photostability of the samples can include analyzing chromaticity of the samples, and purity and impurities of the samples. Herein, as for the chromaticity of the samples, CIEL*a*b* color space can be measured using a spectrophotometer. In addition, the purity and impurities of the samples can be analyzed using HPLC (high-performance liquid chromatography).

HPLC that analyzes purity and impurities of the samples is an analysis method in which a material dissolved in a solvent, a mobile phase, is separated by a column, a stationary phase, and detected using a proper detector. In the HPLC analysis, an interaction between the material to analyze dissolved in a solvent and the stationary phase is an important factor. In an HPLC analysis of a material for an organic material layer of an organic light emitting device, a stationary phase having a non-polar property and a mobile phase (solvent) having a polar property are generally used. In this case, a material having a polar property is eluted first, and a molecule having lower polarity is eluted after staying in the stationary phase for a long period of time. Using such a principle, samples to analyze pass through an HPLC column, and a material for an organic material layer and other impurities in the samples can be separated and detected.

Using the above-described method, photostability can be evaluated by comparing purity and impurities for the samples exposed to light in the four light source zones. In addition, the occurrence of light denaturation can be determined by the generation of impurities additionally detected compared to the sample of the fourth light source zone. More specifically, the degree of denaturation is proportional to increases in the number of impurities and the content of impurities, and for the corresponding light source, photostability can be evaluated as low.

As for the chromaticity of the samples, CIE L'a*b* values can be analyzed using a spectrophotometer. The L* value represents brightness and can be divided into stages from 0 (black) to 100 (white), and having a larger L* value means being close to white. The a* value represents a relation between red and green, and it is red when having a positive (+) value and green when having a negative (−) value. The b* value represents colors of yellow and blue, and it is yellow when having a positive (+) value and blue when having a negative (−) value. Such L*a*b* values can be derived by analyzing values of reflectivity or transmittance of the samples. The samples are opaque in the analysis of the material for an organic material layer of an organic light emitting device, and the value can be derived by analyzing reflectivity.

Using the above-described method, photostability can be evaluated by comparing the L*a*b* values for the samples exposed to light in the four light source zones. In addition, the occurrence of light denaturation can be determined by differences in the L*a*b* values compared to the sample of the fourth light source zone. The degree of denaturation is proportional as the differences in the L'a*b* values increase, and photostability for the corresponding light source can be evaluated as low.

According to one embodiment of the present application, a method for evaluating photostability considering actual light exposure circumstances for a material for an organic material layer of an organic light emitting device can be provided. Particularly, through the apparatus and the method for evaluating photostability according to one embodiment of the present application, an occurrence of denaturation and a degree of denaturation caused by light exposure of the corresponding material for an organic material layer of an organic light emitting device can be quantitatively identified.

Accordingly, through the apparatus and the method for evaluating photostability according to one embodiment of the present application, changes over time in a material for an organic material layer of an organic light emitting device can be verified in advance, and therefore, the apparatus and the method can become a reliability evaluation standard in the related industry.

Hereinafter, the present application will be described in detail with reference to examples in order to specifically describe the present application. However, the examples according to the present application can be modified to various different forms, and the scope of the present application is not to be construed as being limited to the examples described below. Examples of the present application are provided in order to more fully describe the present application to those having average knowledge in the art.

EXAMPLES

Example 1

Approximately 1.5 g of a material for an organic material layer of an organic light emitting device (anthracene-based light emitting layer material) was spread as thinly as possible and placed in a transparent Petri dish. The Petri dish was covered with a glass cover to prepare a sample.

A photostability chamber (VP500L of Votsch Industrietechnik GmbH) as in FIG. 1 was prepared, and a first light source zone (10) provided with a daylight light source; a second light source zone (20) provided with a white fluorescent light source; a third light source zone (30) provided with a UV-cut light source; and a fourth light source zone (40) to which no light is irradiated by the lamp being turned off. Herein, specific types of the daylight light source, the white fluorescent light source and the UV-cut light source are as follows.

Daylight light source: OSRAM L 18 W/640

White fluorescent light source: Philips TLD 18 W/865

UV-cut light source: Philips TLD 18 W/830

To each of the first light source zone to the fourth light source zone, a minimum of 4 samples were introduced. Temperature and humidity conditions of the first light source zone to the fourth light source zone of the photostability chamber were all set to be the same at 25° C. and 40%, and the time of irradiating each light was set at 0.5 hours, 1 hour, 2 hours and 4 hours, and for each time, the samples were taken out from the photostability chamber and analyzed.

The degree of discoloration of the samples before and after irradiating daylight in Example 1 are shown in FIG. 3.

<Experimental Example 1> HPLC Analysis

Results of HPLC measurements using the method for evaluating photostability of the present application are shown in FIG. 4 to FIG. 8. As shown in the results of FIG. 4 to FIG. 8, impurities caused by light exposure were generated with daylight and white fluorescence, and impurities increased in proportion to the time of light exposure. In addition, light-denatured impurities were undetected with UV-cut light in the same manner as under the lamp-off condition.

<Experimental Example 2> Chromaticity Analysis

Results of measuring chromaticity using the method for evaluating photostability of the present application are shown in FIG. 9 and FIG. 10. As shown in the results of FIG. 9 and FIG. 10, discoloration progressed in proportion to time with the daylight and the white fluorescence similar to the results of HPLC measurements. In addition, as shown in the results of FIG. 10, it was identified that, with daylight and white fluorescence, the L* values and the b* values changed due to discoloration caused by light exposure.

Accordingly, from the results of Experimental Examples 1 and 2, it was identified that photostability was low under the daylight and white fluorescence conditions since discoloration was identified after 0.5 hours and impurities were generated, and photostability was maintained under the UV-cut light condition.

As in the results described above, a method for evaluating photostability considering actual light exposure circumstances for a material for an organic material layer of an organic light emitting device can be provided according to one embodiment of the present application. Particularly, through the apparatus and the method for evaluating photostability according to one embodiment of the present application, an occurrence of denaturation and a degree of denaturation caused by light exposure of the corresponding material for an organic material layer of an organic light emitting device can be quantitatively identified.

Accordingly, through the apparatus and the method for evaluating photostability according to one embodiment of the present application, changes over time in a material for an organic material layer of an organic light emitting device can be verified in advance, and therefore, the apparatus and the method can become a reliability evaluation standard in the related industry.

The invention claimed is:

1. A method for evaluating photostability of a material for an organic material layer of an organic light emitting device, the method comprising:

preparing an apparatus for evaluating photostability of the material for an organic material layer of an organic light emitting device, the apparatus comprising a photostability chamber provided with at least four light source zones:

a first light source zone provided with a daylight light source with a color temperature of approximately 4,000K;

a second light source zone provided with a white fluorescent light source with a color temperature of approximately 6,500K;

a third light source zone provided with a UV-cut light source with a color temperature of approximately 3,000K and light only in a wavelength region between about 500 to 700 nm, a fourth light source zone to which no light is irradiated, placing a sample of the material in each of the at least four light source zones;

irradiating daylight light with a color temperature of approximately 4,000K to the first light source zone, irradiating white fluorescent light with a color temperature of approximately 6,500K to the second light source zone, irradiating UV-cut light with a color temperature of approximately 3,000K and light having a wavelength region only between about 500 to 700 nm to the third light source zone, and maintaining the fourth light source zone without irradiating a separate light thereto; and evaluating photostability of the samples by retrieving each of the samples placed in the at least four light source zones and comparing each sample in the first, second, and third light source zones irradiated by the light to the sample of the fourth light source zone not irradiated with light, wherein a time of irradiating the daylight, the white fluorescent light and the UV-cut light is from 0.5 hours to 12 hours.

2. The method of claim 1, wherein the at least four light source zones are each independently maintained at a temperature of 15° C. to 50° C. and a humidity of 20% to 90%.

3. The method of claim 2, wherein the at least four light source zones are al maintained at the same temperature and humidity.

4. The method of claim 1, wherein the at least four light source zones each further comprise a shelf on which the sample is placed.

5. The method of claim 4, wherein the at least four light source zones are vertically provided in the photostability chamber in consecutive order; and the at least four light zones are separated from each other by the shelf.

6. The method of claim 1, wherein the first light source zone is an environment corresponding to a synthesis facility of the material for the organic material layer of the organic light emitting device, wherein the second light source zone is an environment corresponding to a synthesis facility of the material for the organic material layer of the organic light emitting device, wherein the third light source zone is an environment corresponding to a sublimation facility of the material for the organic material layer of the organic light emitting device, and wherein the fourth light source zone is for comparing with the first light source zone to the third light source zone.

7. The method of claim 1, wherein the evaluating of photostability of the samples comprises analyzing chromaticity of the samples, and purity and impurities of the samples.

8. The method of claim 7, wherein the chromaticity of the samples comprises measuring CIE L*a*b* color space of the samples using a spectrophotometer.

9. The method of claim 7, wherein the purity and impurities of the samples are analyzed using HPLC (high-performance liquid chromatography).

* * * * *